United States Patent
Lin et al.

(10) Patent No.: US 10,790,365 B2
(45) Date of Patent: Sep. 29, 2020

(54) LATERAL DIFFUSED METAL OXIDE SEMICONDUCTOR FIELD EFFECT TRANSISTOR

(71) Applicant: Vanguard International Semiconductor Corporation, Hsinchu (TW)

(72) Inventors: Wen-Hsin Lin, Jhubei (TW); Yu-Hao Ho, Keelung (TW); Shin-Cheng Lin, Tainan (TW); Cheng-Tsung Wu, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/903,709

(22) Filed: Feb. 23, 2018

(65) Prior Publication Data

US 2019/0267455 A1    Aug. 29, 2019

(51) Int. Cl.
*H01L 29/40* (2006.01)
*H01L 29/78* (2006.01)
(Continued)

(52) U.S. Cl.
CPC .......... *H01L 29/404* (2013.01); *H01L 23/66* (2013.01); *H01L 29/0653* (2013.01);
(Continued)

(58) Field of Classification Search
CPC .............................. H01L 29/404; H01L 23/66
See application file for complete search history.

(56) References Cited

U.S. PATENT DOCUMENTS

| 6,043,130 A * | 3/2000 | Gregory | H01L 21/8249 257/E21.345 |
| 2002/0043699 A1* | 4/2002 | Akiyama | H01L 21/76264 257/575 |

(Continued)

FOREIGN PATENT DOCUMENTS

| TW | 201244058 A1 | 11/2012 |
| TW | 201601315 A | 11/2012 |

OTHER PUBLICATIONS

Taiwanese Office Action and Search Report, dated Apr. 30, 2018, for Taiwanese Application No. 106140264.

*Primary Examiner* — Wael M Fahmy
*Assistant Examiner* — Sarah K Salerno
(74) *Attorney, Agent, or Firm* — Birch, Stewart, Kolasch & Birch, LLP

(57) ABSTRACT

An LDMOS includes a body region disposed in the substrate and having a first conductivity type; a drift region disposed in the substrate and having a second conductivity type; a source region disposed in the body region and having the second conductivity type; a drain region disposed in the drift region and having the second conductivity type; an isolation region disposed in the drift region between the source region and the drain region; a gate disposed on the body region and the drift region; a source field plate electrically connected to the source region; a drain field plate electrically connected to the drain region; and a first gate plate electrically connected to the gate. The first gate plate is correspondingly disposed above the gate. The shapes of the first gate plate and the gate are substantially the same when viewed from a top view.

12 Claims, 7 Drawing Sheets

(51) Int. Cl.
*H01L 29/06* (2006.01)
*H01L 23/66* (2006.01)
*H01L 29/10* (2006.01)
*H01L 29/423* (2006.01)

(52) U.S. Cl.
CPC ...... *H01L 29/1083* (2013.01); *H01L 29/1095* (2013.01); *H01L 29/42376* (2013.01); *H01L 29/7816* (2013.01)

(56) References Cited

U.S. PATENT DOCUMENTS

| | | | |
|---|---|---|---|
| 2003/0168710 A1* | 9/2003 | Kim | H01L 21/761 |
| | | | 257/500 |
| 2004/0201078 A1* | 10/2004 | Ren | H01L 23/585 |
| | | | 257/500 |
| 2007/0080389 A1* | 4/2007 | Petruzzello | H01L 29/7817 |
| | | | 257/312 |
| 2010/0163987 A1* | 7/2010 | Nakagawa | H01L 29/404 |
| | | | 257/341 |
| 2013/0020632 A1* | 1/2013 | Disney | H01L 29/402 |
| | | | 257/328 |
| 2015/0008539 A1* | 1/2015 | Kanda | H01L 29/0653 |
| | | | 257/409 |
| 2015/0325693 A1 | 11/2015 | Mori | |
| 2017/0025532 A1 | 1/2017 | Mori et al. | |

* cited by examiner

LATERAL DIFFUSED METAL OXIDE SEMICONDUCTOR FIELD EFFECT TRANSISTOR

BACKGROUND

Technical Field

The disclosure relates to a semiconductor technology, and more particularly to a lateral diffused metal oxide semiconductor (LDMOS).

Description of the Related Art

High-voltage semiconductor devices are applied in the field of high-voltage and high-power integrated circuits (ICs). Conventional high-voltage semiconductor devices include lateral diffused metal oxide semiconductors (LDMOS). The advantage of high-voltage semiconductor devices is that they are compatible with other processes and are cost effective. Therefore, high-voltage semiconductor devices are widely applied in such fields as power supply, power management, display driver IC devices, communications, automotive electronics, and industrial control.

Traditionally, poly silicide is formed on polysilicon to decrease gate resistance. This method works in applications with conventional high-voltage device circuits. However, when the high-voltage semiconductor device is used as a switch, the operation frequency is high and a large current is needed. Therefore, the gate width of the devices should be enlarged. As a result, the gate resistance may increase and the device is not uniformly turned on. If the gate resistance is too high, the turn off time may be too long and result in switching loss.

If multiple gate contacts are used, it may help to decrease the gate resistance and make the device turn on uniformly. However, multiple gate contacts may need an extra metal routing area, and this may increase the size of the high-voltage semiconductor device. Moreover, extra gate contacts can only be provided surrounding the device, not inside the device. Therefore, the device may be limited in that it will not turn on uniformly.

Although existing lateral diffused metal oxide semiconductors have generally been adequate for their intended purposes, they have not been entirely satisfactory in all respects and need to be improved, especially the gate resistance of the lateral diffused metal oxide semiconductor.

BRIEF SUMMARY

The present disclosure provides a lateral diffused metal oxide semiconductor (LDMOS). The lateral diffused metal oxide semiconductor includes a body region disposed in a substrate, wherein the body region has a first conductivity type. The lateral diffused metal oxide semiconductor also includes a drift region disposed in the substrate, wherein the drift region has a second conductivity type, which is opposite to the first conductivity type. The lateral diffused metal oxide semiconductor also includes a source region disposed in the body region, wherein the source region has the second conductivity type. The lateral diffused metal oxide semiconductor also includes a drain region disposed in the drift region, wherein the drain region has the second conductivity type. The lateral diffused metal oxide semiconductor also includes an isolation region disposed in the drift region between the source region and the drain region. The lateral diffused metal oxide semiconductor also includes a gate disposed on the body region and the drift region. The lateral diffused metal oxide semiconductor also includes a source field plate electrically connected to the source region. The lateral diffused metal oxide semiconductor also includes a drain field plate electrically connected to the drain region. The lateral diffused metal oxide semiconductor also includes a first gate plate electrically connected to the gate. The first gate plate is correspondingly disposed above the gate, and the shape of the first gate plate and that of the gate are substantially the same when viewed from a top view.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion

DETAILED DESCRIPTION

Figure 1:
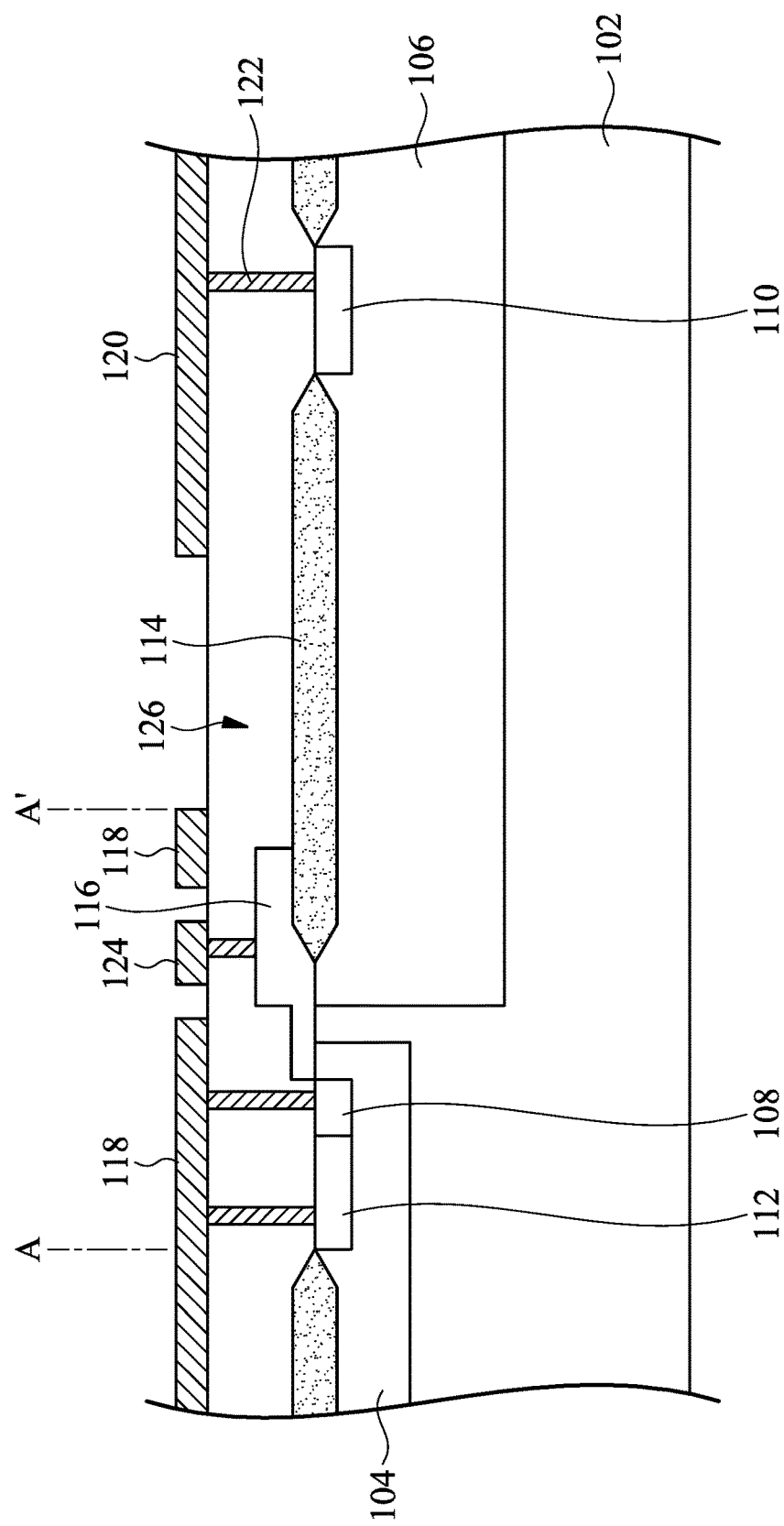
FIG. 1 is a cross-sectional representation of a lateral diffused metal oxide semiconductor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a lateral diffused metal oxide semiconductor (LDMOS) in which a gate plate is formed by dividing the source field plate. The shapes of the gate plate and the gate from a top view are substantially the same. The gate plate is electrically connected to the gate. Since the gate plate and the gate are connected in parallel, the gate resistance may decrease and the device is uniformly turned on without increasing extra metallization layer area.

FIG. 1 is a cross-sectional representation of a lateral diffused metal oxide semiconductor 100 in accordance with some embodiments of the present disclosure. As shown in FIG. 1, the lateral diffused metal oxide semiconductor 100 includes a substrate 102. The substrate 102 may be a semiconductor substrate including elementary semiconductors such as Si and/or Ge; compound semiconductors such as GaN, SiC, GaAs, GaP, InP, InAs, and/or InSb; alloy semiconductors such as SiGe, GaAsP, AlInAs, AlGaAs, GaInAs, GaInP, GaInAsP, and/or a combination thereof. In addition, the substrate 102 may also be semiconductor on insulator (SOI). In some embodiments, the substrate has a first conductivity type.

As shown in FIG. 1, according to some embodiments, the lateral diffused metal oxide semiconductor 100 includes a body region 104 and a drift region 106 disposed near the top surface of the substrate 102. In some embodiments, the body region 104 and the drift region 106 are formed by ion implanting the substrate 102 through a patterned mask. In some embodiments, the body region 104 has a first conductivity type, and the drift region 106 has a second conductivity type opposite to the first conductivity type. For example, when the first conductivity type is P-type, the second conductivity type is N-type. In some other embodiments, when the first conductivity type is N-type, the second conductivity type is P-type. In some embodiments, the P-type dopants may include B, Ga, Al, In, $BF3^+$ ions, or a combination thereof. The N-type dopants may include P, As, N, Sb ions, or a combination thereof.

As shown in FIG. 1, according to some embodiments, the lateral diffused metal oxide semiconductor 100 further includes a source region 108, a drain region 110, and a bulk region 112. The source region 108 and the bulk region 112 are disposed in the body region 104 near the top surface of the substrate 102, and the source region 108 adjoins the bulk region 112. The drain region 110 is disposed in the drift region 106 near the top surface of the substrate 102. In some embodiments, the source region 108, the drain region 110, and the bulk region 112 are formed by ion implanting the substrate 102 through a patterned mask. In some embodiments, the bulk region 112 has a first conductivity type with a dopant concentration higher than the first conductivity type dopant concentration of the body region 104. The source region 108 and the drain region 110 both have the second conductivity type, and their dopant concentration are both higher than the second conductivity type dopant concentration of the drift region 106.

As shown in FIG. 1, according to some embodiments, the lateral diffused metal oxide semiconductor 100 further includes a plurality of isolation regions 114. Among them, at least one isolation region 114 is disposed on the drift region 106 between the source region 108 and the drain region 110. In some embodiments, the isolation region 114 may be field oxide. In some embodiments, the isolation region 114 may be local oxidation of silicon (LOCOS). In some other embodiments, the isolation region 114 may be shallow trench isolation (STI) structure.

As shown in FIG. 1, according to some embodiments, the lateral diffused metal oxide semiconductor 100 further includes a gate 116 disposed on the body region 104 and the drift region 106 and extends to cover a part of the isolation region 114. In some embodiments, the gate 116 may include a gate dielectric layer and a gate electrode layer disposed on the gate dielectric layer (not shown). The gate dielectric layer may include silicon oxide, silicon nitride, or silicon oxynitride. The gate dielectric layer may be grown by an applicable oxidation process (such as a dry oxidation process or a wet oxidation process), a deposition process (such as a chemical vapor deposition process), other applicable processes, or a combination thereof. In some embodiments, the gate dielectric layer may be thermally grown by a thermal oxidation process in oxygen-containing ambient or nitrogen-containing ambient (such as NO or $N_2O$) to form the gate dielectric layer before forming the gate electrode layer.

In some embodiments, the gate electrode layer is formed on the gate dielectric layer. The gate electrode layer may include polysilicon, metal (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer may be formed by forming an electrode material on the substrate 102 by a chemical vapor deposition (CVD) process (e.g., a low pressure chemical vapor deposition process (LPCVD), or a plasma enhanced chemical vapor deposition process (PECVD)), a physical vapor deposition process (PVD) (e.g., a resistive heating evaporation process, an e-beam evaporation process, or a sputtering process), an electroplating process, an atomic layer deposition process (ALD), other applicable processes, or a combination thereof. The electrode material is then patterned by a photolithography process and an etching process to form a gate electrode.

As shown in FIG. 1, according to some embodiments, the lateral diffused metal oxide semiconductor 100 further includes an interlayer dielectric layer (ILD) 126 covering the substrate 102. The interlayer dielectric layer 126 may include one or more single or multiple layers of dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. The low-k dielectric materials may include, but are not limited to, fluorinated silica glass (FSG), hydrogen silsesquioxane (HSQ), carbon doped silicon oxide, amorphous fluorinated carbon, parylene, bis-benzocyclobutenes (BCB), or polyimide. The interlayer dielectric layer 126 may be formed by chemical vapor deposition (CVD) (e.g., a high-density plasma chemical vapor deposition (HDPCVD) process, an atmospheric pressure chemical vapor deposition (APCVD) process, a low-pressure chemical vapor deposition (LP-CVD) process, or a plasma enhanced chemical vapor deposition (PECVD) process), a physical vapor deposition, (PVD), an atomic layer deposition (ALD), a spin-on coating process, other applicable processes, or a combination thereof.

As shown in FIG. 1, according to some embodiments, the lateral diffused metal oxide semiconductor 100 further includes an interconnect structure. The interconnect structure includes a source field plate 118 and a drain field plate 120 disposed on the interlayer dielectric layer 126, and contacts 122 through the interlayer dielectric layer 126. In some embodiments, the source field plate 118 is electrically connected to the source region 108 and the bulk region 112 by the contact 122, and the drain field plate 120 is electrically connected to the drain region 110 by the contact 122.

In some embodiments, openings may be formed in the interlayer dielectric layer 126 (not shown) by a photolithography process (such as photoresist coating, soft baking, exposure, post-exposure baking, development, other applicable techniques, or a combination thereof) and an etching process (such as a wet etching process, a dry etching process, other applicable techniques, or a combination thereof), other applicable techniques, or a combination thereof. After that, a conductive material is filled in the openings to form the contacts 122. In some embodiments, the conductive material of the contact 122 includes metal materials (such as W, Al, or Cu), metal alloys, polysilicon, other applicable conductive materials, or a combination thereof. The contacts 122 may be formed by a physical vapor deposition process (PVD) (e.g., evaporation or sputtering), an electroplating process, an atomic layer deposition process (ALD), other applicable process, or a combination thereof to deposit the conductive materials, and then optionally performing a chemical mechanical polishing (CMP) process or an etching back process to remove extra conductive materials to form the contacts 122.

In some embodiments, a barrier layer may be formed on the sidewalls and the bottoms of the openings before filling the conductive material of the contract 122 (not shown) to prevent the conductive material of the contact 122 diffusing to the interlayer dielectric layer 126. The material of the barrier layer may be TiN, Ti, Ta, TaN, W, WN, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable process, or a combination thereof.

In some embodiments, the source field plate 118 and the drain field plate 120 are formed on the interlayer dielectric layer 126. In some embodiments, the source field plate 118 and the drain field plate 120 may include Cu, W, Ag, Sn, Ni, Co, Cr, Ti, Pb, Au, Bi, Sb, Zn, Zr, Mg, In, Te, Ga, other applicable metallic materials, an alloy thereof, or a combination thereof. In some embodiments, the source field plate 118 and the drain field plate 120 may include a stacked structure of TiN/AlCu/TiN. In some embodiments, a blanket metal layer is formed on the interlayer dielectric layer 126 (not shown) by a physical vapor deposition process (PVD) (e.g., evaporation or sputtering), an electroplating process, an atomic layer deposition process (ALD), other applicable process, or a combination thereof. After that, the blanket metal layer is patterned by a patterning process to form a first metallization layer. In some embodiments, the patterning process may include a photolithography process (such as photoresist coating, soft baking, exposure, post-exposure baking, development, other applicable techniques, or a combination thereof), an etching process (such as a wet etching process, a dry etching process, other applicable techniques, or a combination thereof), other applicable techniques, or a combination thereof.

In some embodiments, the contacts 122, the source field plate 118, and the drain field plate 120 may be formed separately. In some other embodiments, the contact 122, the source field plate 118, and the drain field plate 120 may be formed at the same time by a dual damascene process.

As shown in FIG. 1, according to some embodiments, the lateral diffused metal oxide semiconductor 100 further includes the first gate plate 124 electrically connected to the gate 116 by the contact 122. In some embodiments, the first gate plate 124 and the source field plate 118 are at the same metallization layer, for example, the first metallization layer. In some embodiments, the first gate plate 124 is formed by dividing the source field plate 118. Since the first gate plate 124 and the source field plate 118 are at the same metallization layer, the first gate plate 124 and the source field plate 118 may be formed by the same deposition and patterning process to save production time and cost.

Figure 2A:
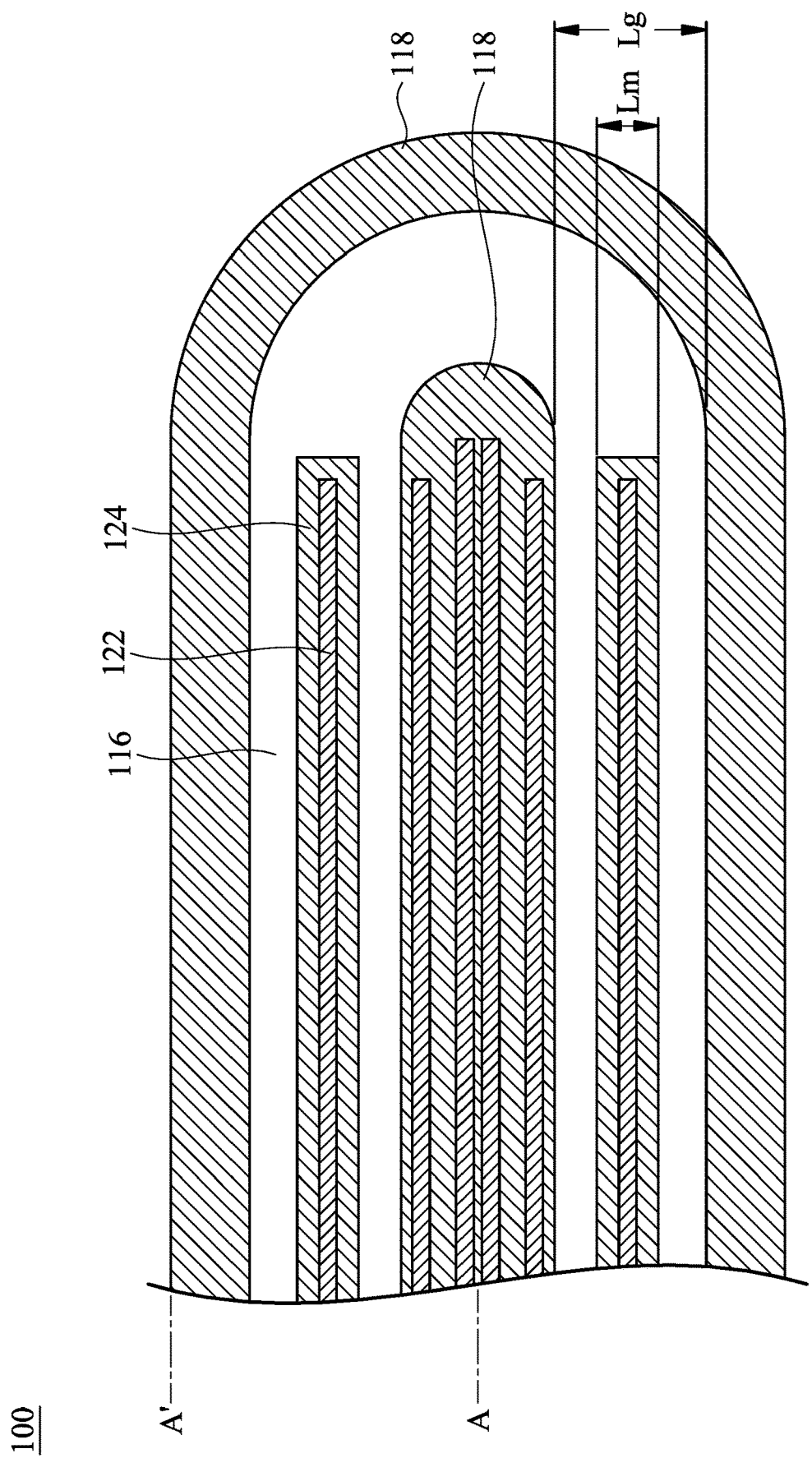
FIG. 2A is a top view of a lateral diffused metal oxide semiconductor in accordance with some embodiments.

FIG. 2A is a top view of a lateral diffused metal oxide semiconductor 100 in accordance with some embodiments of the present disclosure. FIG. 1 is the cross-sectional representation of the lateral diffused metal oxide semiconductor 100 in FIG. 2A along line AA'. For the purpose of brevity, the contacts 122 under the source field plate 118 and the first gate plate 124 are shown in FIG. 2A. As shown in FIG. 2A, the gate length Lg is the length of the gate 116 along the direction of line AA', and the length Lm of the first gate plate 124 is the length of the gate plate 124 along the direction of line AA'.

Figure 2B:
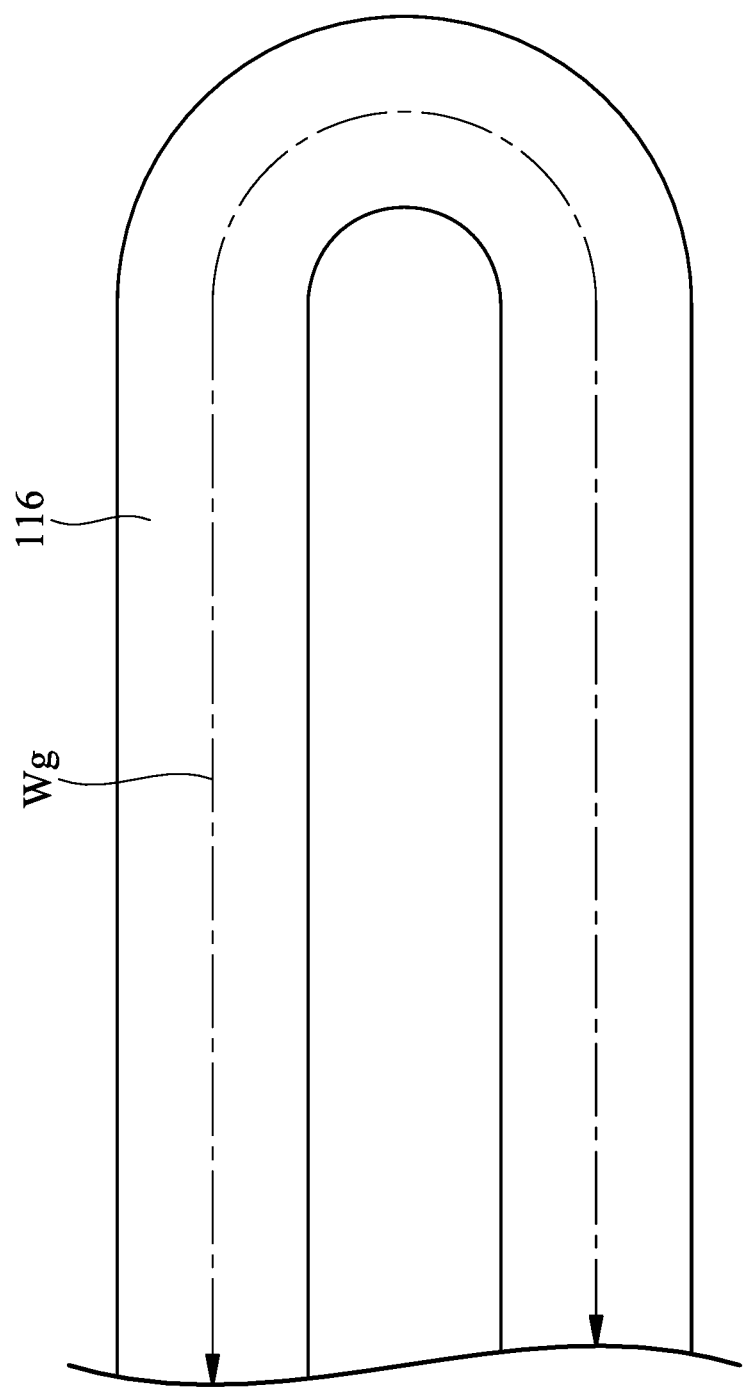
FIG. 2B is a partial top view of a lateral diffused metal oxide semiconductor in accordance with some embodiments.

FIG. 2B is a partial top view of a lateral diffused metal oxide semiconductor 100 in accordance with some embodiments of the present disclosure. For the purpose of brevity, only the gate 116 is shown in FIG. 2B. As shown in FIGS. 2A and 2B, the gate width Wg is the total length of the gate 116 along the direction perpendicular to line AA'.

As shown in FIG. 2A, according to some embodiments, the first gate plate 124 is substantially disposed correspondingly above the gate 116 except for the turning point of the gate 116 routing. Therefore, the shapes of the first gate plate 124 and the gate 116 are substantially the same when viewed from the top view. The size of the gate width Wg may affect the value of the gate resistance. When the width Wg is greater, the gate resistance is greater. Since the electric potential of the first gate plate 124 and the gate 116 are equal, the first gate plate 124 and the gate 116 are electrically connected in parallel along the direction of the gate 116 width Wg.

Figure 3:
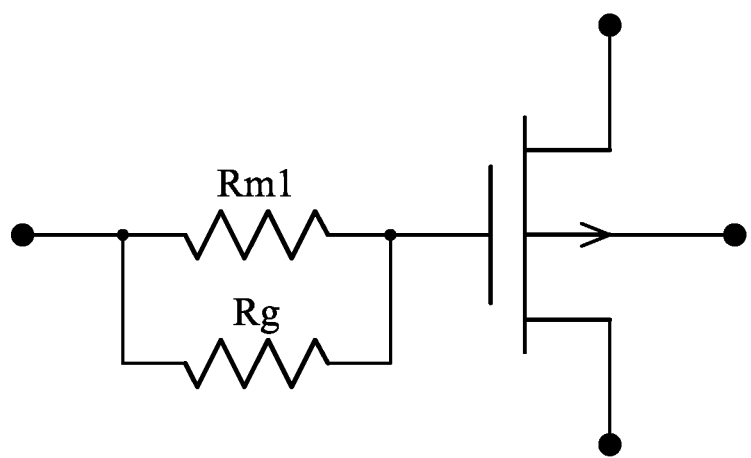
FIG. 3 is a circuit diagram of a lateral diffused metal oxide semiconductor in accordance with some embodiments.

FIG. 3 is circuit diagram of a lateral diffused metal oxide semiconductor 100 in accordance with some embodiments of the present disclosure. As shown in FIG. 3, the Rm1 is the resistance of the first gate plate 124, and the Rg is the resistance of the gate 116. The Rm1 and the Rg are electrically connected in parallel.

As shown in FIG. 1, compared to cases in which there is only a gate 116, the gate resistance may be further reduced by electrically connecting the first gate plate 124 in parallel. The first gate plate 124 and the gate 116 each has a resistance, and the lower of these two values is the key factor dominating gate resistance. Since the first gate plate 124 is disposed along the gate 116, no extra metal routing area is needed to reduce the gate resistance. Furthermore, the device may be also turned on uniformly along the direction of the gate width Wg.

In some embodiments shown in FIG. 2A, the first gate plate 124 has a length Lm that is shorter than the length Lg of the gate 116. In some other embodiments, the first gate plate 124 has a length Lm that is longer than or equal to the length Lg of the gate 116. The dimensions of the length Lm of the first gate plate 124 and the length Lg of the gate 116 affect the respective resistance of the first gate plate 124 and the gate 116. When the length is longer, the resistance is lower. The length Lm of the first gate plate 124 and the length Lg of the gate 116 may respectively be fine-tuned to meet the demands of the process and the gate resistance in order to provide the best conditions in terms of gate resistance.

In some embodiments, the operation frequency of the lateral diffused metal oxide semiconductor 100 is between 1 MHz and 100 MHz. If the operation frequency is too high, the device may not be easily turned on uniformly. If the operation frequency is too low, the performance may not be enhanced effectively.

In some embodiments shown in FIG. 2A, the gate 116 has a width Wg of between 5000 μm and 20000 μm. If the width Wg of the gate 116 is too narrow, the current generated in the high-voltage device is not large enough. If the width Wg of the gate 116 is too wide, the gate resistance increases and the device may not be turned on uniformly along the direction of the gate 116.

According to some embodiments, the shape of the lateral diffused metal oxide semiconductor 100 may extend as a multi-finger shape from a top view. However, in some other embodiments, the geometric shape may also be an ellipse, or a circle. In a certain area, if the shape from the top view is a multi-finger, a greater gate width is provided to enhance the current. It should be understood that the shape of the lateral diffused metal oxide semiconductor 100 from the top view may also be another geometric shape, depending on the demands of the process.

In the embodiments shown in FIG. 1, the shape of the first gate plate 124 and the shape of the gate 116 from the top view are substantially the same. To electrically connect the first gate plate 124 to the gate 116 in parallel, the gate resistance may decrease and the device may turn on uniformly without increasing the metal routing area.

Figure 4:
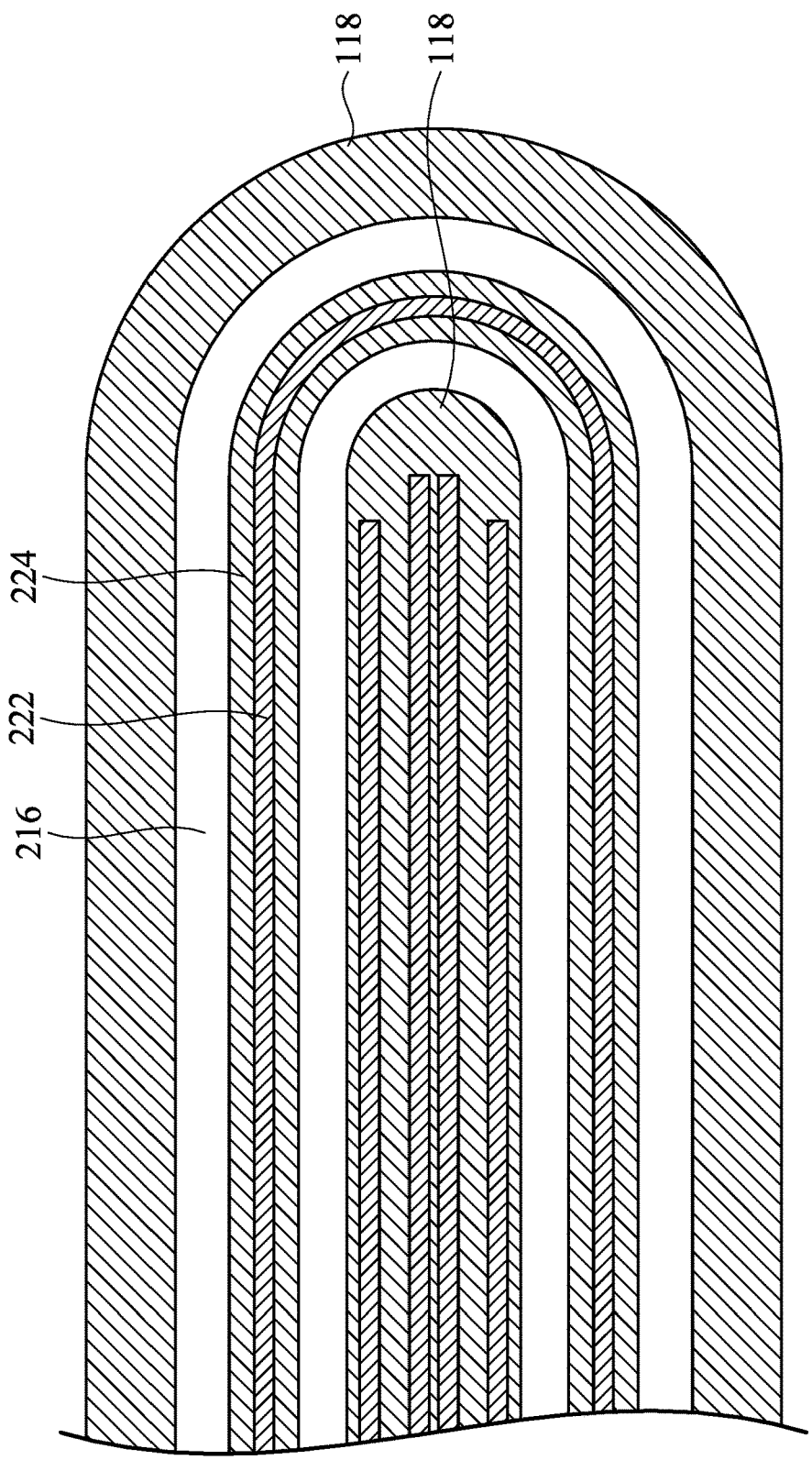
FIG. 4 is a top view of a lateral diffused metal oxide semiconductor in accordance with some embodiments.

FIG. 4 is a top view of a lateral diffused metal oxide semiconductor 200 in accordance with some embodiments of the present disclosure. Some processes or devices are the same as, or similar to, those described in the embodiments above, and therefore they use the same symbols. For the purpose of brevity, the descriptions of these processes and devices are not repeated herein. The difference from the embodiments described above is that, as shown in FIG. 4, the first gate plate 224 is completely disposed correspondingly above the gate. Therefore, the shape of the first gate plate 224 and that of the gate 216 are exactly the same, when viewed from a top view. Compared to the embodiment in FIG. 2A, the portion where the gate 216 and the first gate plate 224 are connected in parallel increases in area, and so the gate resistance of the two (which are electrically connected in parallel) decreases further, and the device can be turned on uniformly along the direction of the gate width Wg.

In the embodiment as shown in FIG. 4, compared to cases where the shape of the gate plate and that of the gate are substantially the same, the shape of the first gate plate 224 and that of the gate 216 are completely the same. The first gate plate 224 is electrically connected to the gate 216 in parallel. The gate resistance may be decreased further and the device can be turned on uniformly.

Figure 5:
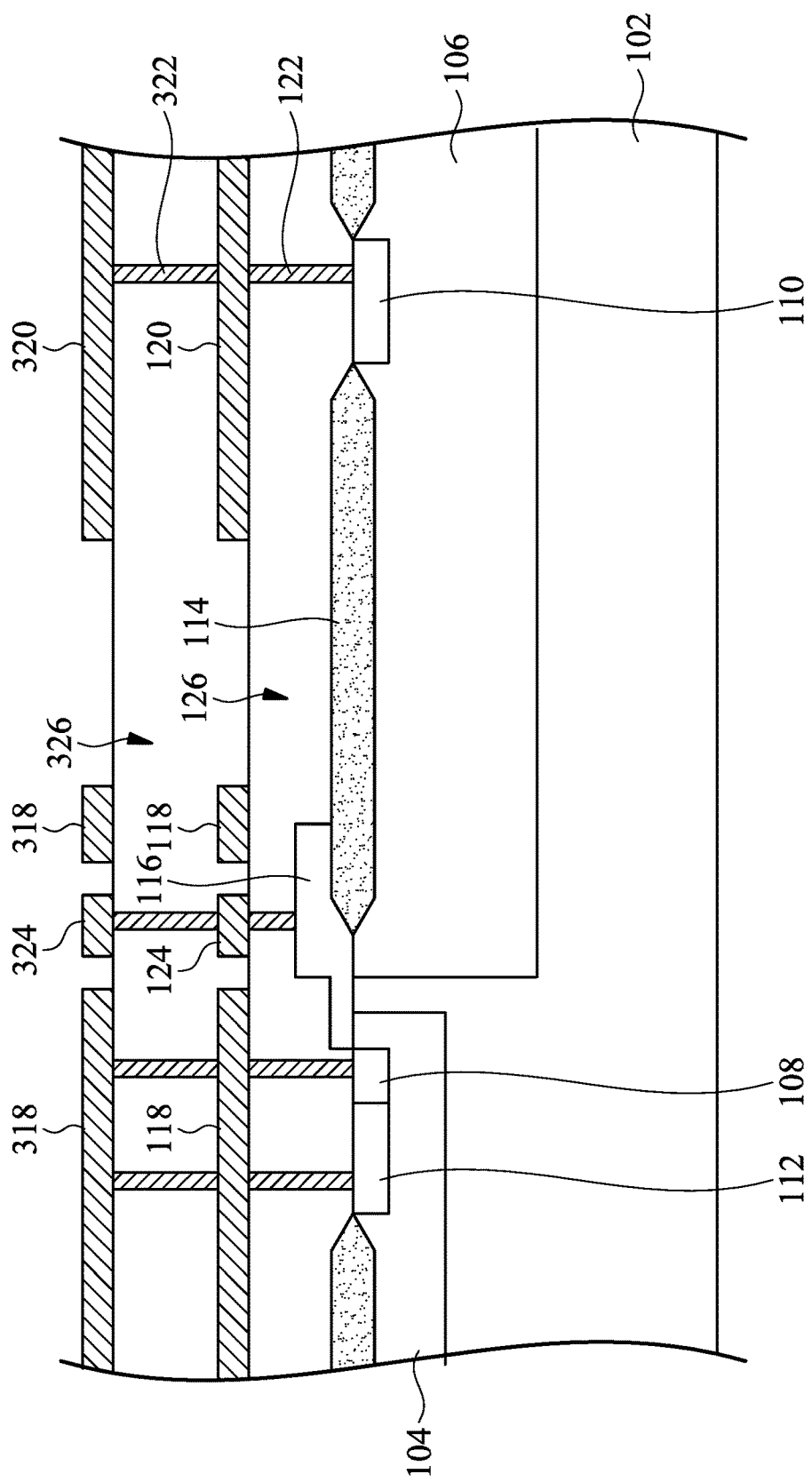
FIG. 5 is a cross-sectional representation of a lateral diffused metal oxide semiconductor in accordance with some other embodiments.

FIG. 5 is a top view of a lateral diffused metal oxide semiconductor 300 in accordance with some other embodiments of the present disclosure. Some processes or devices are the same as, or similar to, those described in the embodiments above, and therefore they use the same symbols. For the purpose of brevity, the descriptions of these processes and devices are not repeated herein. The difference from the embodiments described above is that as shown in FIG. 5, the lateral diffused metal oxide semiconductor 300 further includes an inter-metal dielectric (IMD) layer 326 covering the interlayer dielectric layer 126, a source field plate 318 on the source field plate 118, a drain field plate 320 on the drain field plate 120, and a second gate plate 324 disposed on the first gate plate 124. Some processes or materials of forming the source field plate 318, the drain field plate 320, and the second gate plate 324 are the same as, or similar to, those forming the source field plate 118, the drain field plate 120, and the first gate plate 124. For the purpose of brevity, the descriptions of these processes and materials are not repeated herein.

In some embodiments, the dielectric material of the inter-metal dielectric layer 326 may include oxides, spin-on glass (SOG), low-k dielectric materials such as fluorinated silica glass (FSG) and hydrogen silsesquioxane (HSQ). The inter-metal dielectric layer 326 may be formed by a high aspect ratio process (HARP) and/or chemical vapor deposition (CVD) (such as a high density plasma chemical vapor deposition (HDPCVD) process, a plasma enhanced chemical vapor deposition (PECVD) process, a low-pressure chemical vapor deposition (LPCVD) process, an atmospheric pressure chemical vapor deposition (APCVD) process to form dielectric materials on the dielectric layers 126. Next, a chemical mechanical polishing (CMP) process is optionally performed on the inter-metal dielectric layer 326 to planarize the inter-metal dielectric layer 326.

The second gate plate 324 is electrically connected with the first gate plate 124 by the via 322 through the inter-metal dielectric layer 326. In some embodiments, since the second gate plate 324 is disposed along the gate 116 and the first gate plate 124, the shapes of the second gate plate 324 and the gate 116 are substantially the same from a top view (not shown). Since the electric potential of the gate 116, the first gate plate 124 and the second gate plate 324 are equal, the second gate plate 324, the gate 116, and the first gate plate 124 and are electrically connected in parallel along the direction of the gate 116 width Wg.

Figure 6:
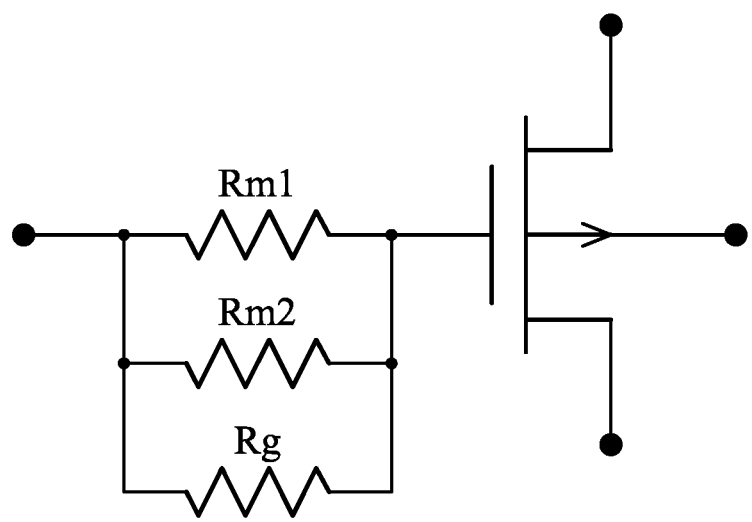
FIG. 6 is a circuit diagram of a lateral diffused metal oxide semiconductor in accordance with some other embodiments.

FIG. 6 is circuit diagram of a lateral diffused metal oxide semiconductor 300 in accordance with some embodiments of the present disclosure. As shown in FIG. 6, the Rm1 is the resistance of the first gate plate 124, the Rm2 is the resistance of the second gate plate 324, and the Rg is the resistance of the gate 116. Rm1, Rm2 and Rg are electrically connected in parallel.

In the embodiments shown in FIG. 5, compared to cases where the gate 116 is only electrically connected to the first gate plate 124 in parallel, by electrically connecting the second gate plate 324 in parallel, which has substantially the same shape as the gate 116 when seen from a top view, the gate resistance may be reduced further and the device may turned on uniformly without increasing the metal routing area.

It should be noted that, in FIG. 5, there are two gate plates disposed above the gate 116, including the first gate plate 124 and the second gate plate 324. However, the present disclosure is not limited thereto. Depending on the demands of the process, more than two gate plates may be disposed above the gate 116.

As mentioned above, the present disclosure provides a lateral diffused metal oxide semiconductor. The source field plate is divided to form one or more gate plates above the gate, making their shapes substantially the same as the gate from a top view. Moreover, the gate plate is electrically connected to the gate in parallel by the contacts/vias. In this way, the gate resistance may be reduced, the device may be turned on uniformly, the switch turn-off time is shortened, and the switching loss is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lateral diffused metal oxide semiconductor (LDMOS), comprising:
   a body region disposed in a substrate, and the body region has a first conductivity type;
   a drift region disposed in the substrate, and the drift region has a second conductivity type opposite to the first conductivity type;
   a source region disposed in the body region, and the source region has the second conductivity type;
   a drain region disposed in the drift region, and the drain region has the second conductivity type;
   an isolation region disposed in the drift region between the source region and the drain region, wherein the isolation region is field oxide, local oxidation of silicon, or shallow trench isolation;
   a gate disposed on the body region and the drift region;
   a source field plate electrically connected to the source region;
   a drain field plate electrically connected to the drain region; and
   a first gate plate electrically connected to the gate through an interlayer dielectric layer over the gate, wherein the first gate plate is disposed laterally between two portions of the source field plate;
   wherein the first gate plate is correspondingly disposed above the gate, and a shape of the first gate plate and the gate are substantially the same from a top view.

2. The lateral diffused metal oxide semiconductor as claimed in claim 1, further comprising:
   a bulk region disposed in the body region and adjacent the source region, and the bulk region has the first conductivity type;
   wherein the bulk region is electrically connected to the source field plate.

3. The lateral diffused metal oxide semiconductor as claimed in claim 1, wherein the first gate plate and the gate are electrically connected in parallel.

4. The lateral diffused metal oxide semiconductor as claimed in claim 1, wherein the shape of the first gate plate and the gate are completely the same from a top view.

5. The lateral diffused metal oxide semiconductor as claimed in claim 1, wherein the source field plate and the first gate plate are patterned from the same metallization layer.

6. The lateral diffused metal oxide semiconductor as claimed in claim 1, wherein a length of the first gate plate is shorter than a length of the gate.

7. The lateral diffused metal oxide semiconductor as claimed in claim 1, wherein a length of the first gate plate is longer than or equal to a length of the gate.

8. The lateral diffused metal oxide semiconductor as claimed in claim 1, wherein the shape is a multi-finger, an ellipse, or a circle.

9. The lateral diffused metal oxide semiconductor as claimed in claim 1, wherein the gate has a width of between 5000 μm and 20000 μm.

10. The lateral diffused metal oxide semiconductor as claimed in claim 1, wherein the lateral diffused metal oxide semiconductor operates at a frequency of between 1 MHz and 100 MHz.

11. The lateral diffused metal oxide semiconductor as claimed in claim 1, further comprising:
    a second gate plate electrically connected to the first gate plate;
    wherein the second gate plate is disposed in a metallization layer above the first gate plate.

12. The lateral diffused metal oxide semiconductor as claimed in claim 11, wherein the second gate plate is correspondingly disposed above the gate, and a shape of the second gate plate and the gate are substantially the same from a top view.

* * * * *